United States Patent
Nair et al.

(10) Patent No.: US 10,558,518 B2
(45) Date of Patent: Feb. 11, 2020

(54) DYNAMIC ADJUSTMENTS WITHIN MEMORY SYSTEMS

(71) Applicant: International Business Machines Corporation, Armonk, NY (US)

(72) Inventors: Prashant Jayaprakash Nair, Elmsford, NY (US); Alper Buyuktosunoglu, White Plains, NY (US); Pradip Bose, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 15/810,336

(22) Filed: Nov. 13, 2017

(65) Prior Publication Data

US 2019/0146864 A1   May 16, 2019

(51) Int. Cl.
*G06F 11/10*   (2006.01)
*G06F 11/07*   (2006.01)
(Continued)

(52) U.S. Cl.
CPC ........ *G06F 11/0793* (2013.01); *G06F 3/0604* (2013.01); *G06F 3/0634* (2013.01); *G06F 3/0673* (2013.01); *G06F 11/073* (2013.01); *G06F 11/076* (2013.01); *G06F 1/324* (2013.01); *G06F 1/3296* (2013.01);
(Continued)

(58) Field of Classification Search
CPC ............ G06F 11/1008; G06F 11/1012; G06F 11/1016; G06F 11/102; G06F 11/1044; G06F 11/1048; G06F 11/1056; G06F 11/106; G06F 11/1072; G06F 3/0604; G06F 3/0614; G06F 3/0634; G06F 3/0673; G06F 1/324; G06F 1/3296; G11C 29/52; G11C 29/028
See application file for complete search history.

(56) References Cited

U.S. PATENT DOCUMENTS 5,365,487 A    11/1994  Patel et al.
5,400,267 A *   3/1995  Denen .................. A61B 17/00
                                                  128/908
(Continued)

OTHER PUBLICATIONS

Chang et al., "Understanding Latency Variation in Modern DRAM Chips: Experimental Characterization, Analysis, and Optimization", SIGMETRICS '16, Jun. 14-18, 2016, Antibes Juan-Les-Pins, France, © 2016 ACM, pp. 323-366, DOI: <http://dx.doi.org/10.1145/2896377.2901453>.

(Continued)

*Primary Examiner* — Joseph O Schell
(74) *Attorney, Agent, or Firm* — Robert J. Shatto

(57) ABSTRACT

A computer monitors a memory system during operation. The computer detects a first number of errors in the memory system. The computer determines that the first number of errors is below an error level threshold. The computer lowers a first group of one or more memory parameters of the memory system by a first amount. After the lowering of one or more memory parameters by the first amount, the computer detects a second number of errors in the memory system. The computer determines that the second number of errors is above the error level threshold. The computer raises a second group of one or more memory parameters of the memory system by a second amount.

20 Claims, 4 Drawing Sheets

(51) Int. Cl.
  *G06F 3/06* (2006.01)
  *G11C 16/34* (2006.01)
  *G06F 1/324* (2019.01)
  *G06F 1/3296* (2019.01)
(52) U.S. Cl.
  CPC ...... *G06F 11/1008* (2013.01); *G06F 11/1048* (2013.01); *G11C 16/349* (2013.01)

(56) References Cited

U.S. PATENT DOCUMENTS

| | | | | |
|---|---|---|---|---|
| 7,382,366 | B1* | 6/2008 | Klock | G06F 1/206 |
| | | | | 345/213 |
| 7,849,332 | B1* | 12/2010 | Alben | G06F 1/206 |
| | | | | 713/300 |
| 8,185,786 | B2 | 5/2012 | Flautner et al. | |
| 8,392,779 | B2* | 3/2013 | Schneider | G06F 11/1004 |
| | | | | 323/315 |
| 8,639,874 | B2 | 1/2014 | Maule et al. | |
| 8,806,283 | B1* | 8/2014 | Allison | G06F 11/2284 |
| | | | | 365/200 |
| 9,158,356 | B2 | 10/2015 | Wu et al. | |
| 9,407,294 | B2 | 8/2016 | Hanham et al. | |
| 2012/0072795 | A1* | 3/2012 | Yamamoto | G11C 16/3418 |
| | | | | 714/721 |
| 2013/0132652 | A1* | 5/2013 | Wood | G06F 12/0246 |
| | | | | 711/103 |
| 2014/0026003 | A1* | 1/2014 | Chen | G06F 11/1048 |
| | | | | 714/708 |
| 2014/0026012 | A1* | 1/2014 | Kim | G11C 29/02 |
| | | | | 714/763 |
| 2014/0226398 | A1* | 8/2014 | Desireddi | G11C 16/3436 |
| | | | | 365/185.03 |
| 2014/0229131 | A1 | 8/2014 | Cohen et al. | |
| 2015/0135033 | A1 | 5/2015 | Ellis et al. | |
| 2016/0211032 | A1 | 7/2016 | Pang et al. | |
| 2017/0213597 | A1* | 7/2017 | Micheloni | G11C 16/0483 |
| 2017/0269664 | A1* | 9/2017 | Garner | G06F 1/30 |

OTHER PUBLICATIONS

IBM, "Self Adjusting Power Scheme for Optimal Power Reduction", An IP.com Prior Art Database Technical Disclosure, IP.com No. IPCOM000031185D, Publication Date: Sep. 16, 2004, 9 pages.

Khan et al., "The Efficacy of Error Mitigation Techniques for DRAM Retention Failures: A Comparative Experimental Study", SIGMETRICS'14, Jun. 16-20, 2014, Austin, Texas, USA, Copyright 2014 ACM, pp. 519-532, <http://dx.doi.org/10.1145/2591971.2592000>.

Lee et al., "Adaptive-Latency DRAM: Optimizing DRAM Timing for the Common-Case", © 2015 IEEE, 2015 IEEE 21st International Symposium on High Performance Computer Architecture (HPCA), pp. 489-501.

* cited by examiner

DYNAMIC ADJUSTMENTS WITHIN MEMORY SYSTEMS

STATEMENT REGARDING FEDERALLY SPONSORED RESEARCH OR DEVELOPMENT

This invention was made with Government support under contract number HR0011-13-C-0022 awarded by Defense Advanced Research Projects Agency (DARPA). The Government has certain rights to this invention.

BACKGROUND

The present disclosure generally relates to memory systems, and more specifically, to dynamically tuning memory systems.

Memory systems can be a major source of power consumption and a performance bottleneck in a variety of computer systems ranging from high end servers to mobile devices and internet of things devices. Memory systems, whether constructed as dual in-line memory modules (DIMMs), erasable programmable read-only memory (EPROM), flash memory, or any other memory device, commonly suffer from variation in quality. To account for such variation, memory manufacturers commonly identify worst case parameters which all (or most) of the manufactured memory devices will successfully operate at. These worst-case parameters are then used for all of the memory devices, despite many of the devices being capable of performing at better-than-worst-case parameters.

SUMMARY

Disclosed herein are embodiments of a method, system, and computer program product for dynamic memory tuning. A computer monitors a memory system during operation. The computer detects a first number of errors in the memory system. The computer determines that the first number of errors is below an error level threshold. The computer lowers a first group of one or more memory parameters of the memory system by a first amount. After the lowering of one or more memory parameters by the first amount, the computer detects a second number of errors in the memory system. The computer determines that the second number of errors is above the error level threshold. The computer raises a second group of one or more memory parameters of the memory system by a second amount.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
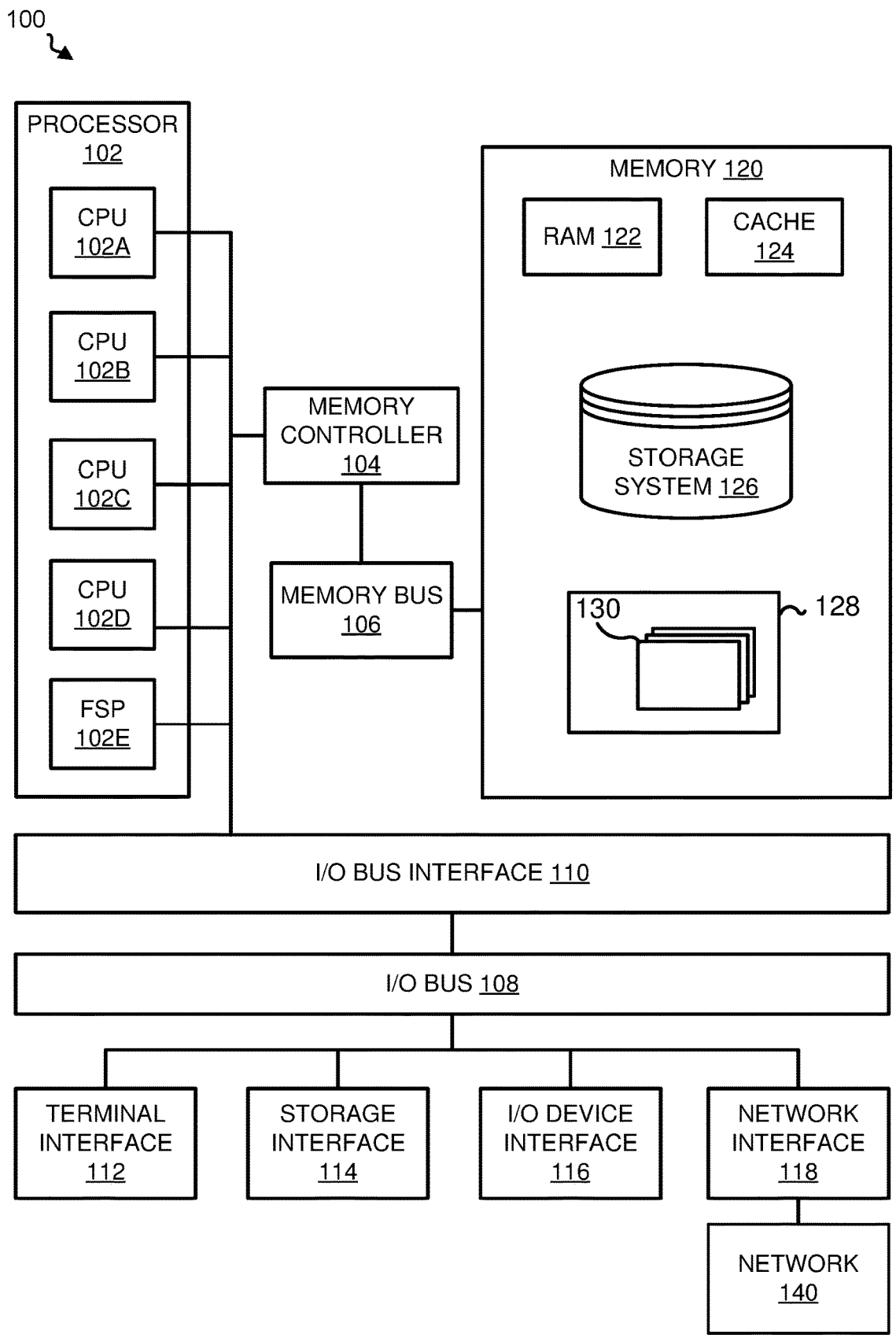
FIG. 1 depicts a high-level block diagram of an example computer system in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate generally to the field of memory systems, and more specifically, to dynamically tuning memory systems. While the present disclosure is not necessarily limited to such applications, various aspects of the disclosure can be appreciated through a discussion of various examples using this context.

Due to variation in quality of memory devices, memory manufacturers commonly identify worst case parameters which all (or most) of the manufactured memory devices will successfully operate at. These parameters can include the voltage required for the memory device or portions thereof to operate, the frequency at which the memory device or portions thereof will operate at, and the memory timings (including access timings and refresh timings) the memory device or portions thereof will utilize.

These worst-case parameters are then used for all of the memory devices, despite many of the devices being capable of performing at better-than-worst-case parameters. Additionally, portions of some devices may be able to operate at better-than-worst-case parameters. For example, in a memory system using dynamic random-access memory (DRAM), cells within the DRAM device can potentially operate using lower access and refresh timings, operate at lower voltage, and operate at higher frequencies than the manufacturer specified parameters. Additionally, some device manufacturers add guard-bands further worsening the manufacturer specified parameters for additional protection against variation or to account for anticipated issues as devices age, to prevent devices from failing prematurely. In setting these parameters at worst case values or lower, device manufacturers can limit device errors and provide for low failure rates to ensure working products at the cost of performance and efficiency.

As used herein, references to "lowering" memory parameters refer to setting the memory parameters to values which tighten the margin for functional correctness. Similarly, references to "raising" memory parameters refer to setting the memory parameters to values which widen that margin to a safer or more robust operational point. For some memory parameters, this "lowering" may correspond to numerically decreasing a memory parameter (e.g., "lowering" a voltage parameter results in a numerically decreased voltage parameter, "lowering" a refresh timing by lowering the rate of refreshes results in a numerically decreased refresh timing, etc.), but for other memory parameters, "raising" may correspond to a numerically lowered memory parameter (e.g., decreasing the timing period between successive refreshes could correspond to "raising" a refresh timing).

Embodiments of the present disclosure include dynamically tuning a memory system to operate at better-than-worst-case parameters to improve performance and efficiency, while preventing errors and ensuring operability. In accordance with embodiments disclosed herein, memory devices can be operated at lower voltages, lower access timings, and/or lower refresh timings by dynamically tuning these parameters. These parameters can be lowered together until errors start to be detected, raised to successful operating parameters, and further tuned by individually lowering parameters further until errors are detected again. Errors can be detected for example using error correcting codes (ECC) or spare memory blocks. Various known-good parameters can be saved and evaluated to determine a preferred parameter set. These preferred parameters can then be loaded and used as the device operates. Additionally, memory devices can be monitored in runtime to continually improve upon operating parameters. As such, instead of using worst-case parameters, memory devices or portions thereof can utilize improved parameters which can improve performance and efficiency.

The aforementioned improvements and/or advantages of improved performance and efficiency are example improvements and/or advantages. These improvements and/or advantages are a non-exhaustive list of example advantages. Embodiments of the present disclosure exist which can contain none, some, or all of the aforementioned advantages and/or improvements.

FIG. 1 depicts a high-level block diagram of an example computer system 100 (e.g., a host device) that can be used in implementing one or more of the methods (such as methods 200, 300, and 400 in accordance with FIGS. 2, 3, and 4, respectively, as described infra), tools, and modules, and any related functions, described herein, in accordance with embodiments of the present disclosure. In some embodiments, the components of the computer system 100 can comprise one or more processors 102, a memory subsystem 120, a terminal interface 112, a storage interface 114, an I/O (Input/Output) device interface 116, and a network interface 118, all of which can be communicatively coupled, directly or indirectly, for inter-component communication via a memory bus 106, an I/O bus 108, and an I/O bus interface unit 110.

The computer system 100 can contain one or more general-purpose programmable central processing units (CPUs) 102A, 102B, 102C, and 102D (four CPUs are shown by way of example and should not be read as limiting to or requiring four CPUs), herein generically referred to as processor 102 or CPU 102. Any or all of the CPUs of CPU 102 can contain multiple processing cores in various embodiments. In some embodiments, the computer system 100 can contain multiple processors typical of a relatively large system; however, in other embodiments the computer system 100 can alternatively be a single CPU system. Each CPU 102 can execute instructions stored in the memory subsystem 120 and can include one or more levels of on-board cache that provide temporary storage of instructions and data for the CPUs 102. The CPUs 102 can be comprised of one or more circuits configured to perform one or more methods consistent with embodiments of the present disclosure.

In some embodiments, the computer system 100 can additionally or alternatively contain a flexible service processor (FSP) 102E. As used herein, a flexible service processor is a component which provides diagnostics, initialization, configuration, run-time error detection and correction. In some embodiments, FSP 102E can be used to monitor and control operations relating to dynamic memory tuning and can be used in implementing at least part of one or more of the methods (such as methods 200, 300, and 400 in accordance with FIGS. 2, 3, and 4, respectively, as described infra). In other embodiments, these functions relating to dynamic memory tuning can be performed by other components within computer system 100, be embodied in firmware, or be embodied in software. The control of data flow from the processor 102 to the memory subsystem 120 can be facilitated by memory controller 104. The memory controller 104 can be configured to direct data to appropriate locations (e.g., addresses) within the memory subsystem 120. In some embodiments, memory controller 104 can be used to monitor and control operations relating to dynamic memory tuning and can be used in implementing at least part of one or more of the methods (such as methods 200, 300, and 400 in accordance with FIGS. 2, 3, and 4, respectively, as described infra).

Memory subsystem 120 can include computer system readable media in the form of volatile memory, such as random-access memory (RAM) 122 or cache memory 124. Computer system 100 can further include other removable/non-removable, volatile/non-volatile computer system storage media. By way of example only, storage system 126 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 120 can include flash memory, e.g., a flash memory stick drive or a flash drive. In some embodiments, the storage system 126 can be replaced by storage area-network (SAN) devices, the cloud, or other devices connected to the computer system 100 via the I/O device interface 116 or a network 140 via the network interface 118. Memory devices can be connected to memory bus 106 by one or more data media interfaces. The memory subsystem 120 can include at least one program product having a set (e.g., at least one) of program modules that are configured to carry out the functions of various embodiments.

Further, one or more memory modules can be included in the storage system 126. For example, one or more DIMMs can be included in the storage system 126 in lieu of or in addition to RAM 122. The one or more memory modules can include their own memory controllers, processors, buses, and any other suitable memory module components.

It is noted that FIG. 1 is intended to depict representative components of an exemplary computer system 100. In some embodiments, however, individual components can have greater or lesser complexity than as represented in FIG. 1, components other than or in addition to those shown in FIG. 1 can be present, and the number, type, and configuration of such components can vary.

One or more programs/utilities 128, each having at least one set of program modules 130 can be stored in memory 120. The programs/utilities 128 can include a hypervisor (also referred to as a virtual machine monitor), one or more operating systems, one or more application programs, other program modules, user interfaces, and program data. Each of the operating systems, one or more application programs, other program modules, and program data or some combination thereof, can include an implementation of a networking environment. In some embodiments, one or more programs/utilities 128, each having at least one set of program modules 130 can be used to monitor and control operations relating to dynamic memory tuning and can be used in implementing one or more of the methods (such as methods 200, 300, and 400 in accordance with FIGS. 2, 3, and 4, respectively, as described infra).

The computer system 100 can interface a variety of peripheral devices, storage devices, and networks (including network 140) through the terminal interface 112, storage interface 114, I/O device interface 116, and network interface 118. For example, I/O device interface 116 can receive input from a user and present information to a user and/or a device interacting with computer system 100.

Although the memory bus 106 is shown in FIG. 1 as a single bus structure providing a direct communication path among the CPUs 102, the memory subsystem 120, and the I/O bus interface 110, the memory bus 106 can, in some embodiments, include multiple different buses or communication paths, which can be arranged in any of various forms, such as point-to-point links in hierarchical, star or web configurations, multiple hierarchical buses, parallel and redundant paths, or any other appropriate type of configuration. Furthermore, while the I/O bus interface 110 and the I/O bus 108 are shown as single respective units, the computer system 100 can, in some embodiments, contain multiple I/O bus interface units 110, multiple I/O buses 108, or both. Further, while multiple I/O interface units are shown, which separate the I/O bus 108 from various communications paths running to the various I/O devices, in other embodiments some or all of the I/O devices can be connected directly to one or more system I/O buses.

In some embodiments, the computer system 100 can be a multi-user mainframe computer system, a single-user system, or a server computer or similar device that has little or no direct user interface, but receives requests from other computer systems (clients). Further, in some embodiments, the computer system 100 can be implemented as a desktop computer, portable computer, laptop or notebook computer, tablet computer, pocket computer, telephone, smart phone, network switches or routers, or any other appropriate type of electronic device.

Figure 2:
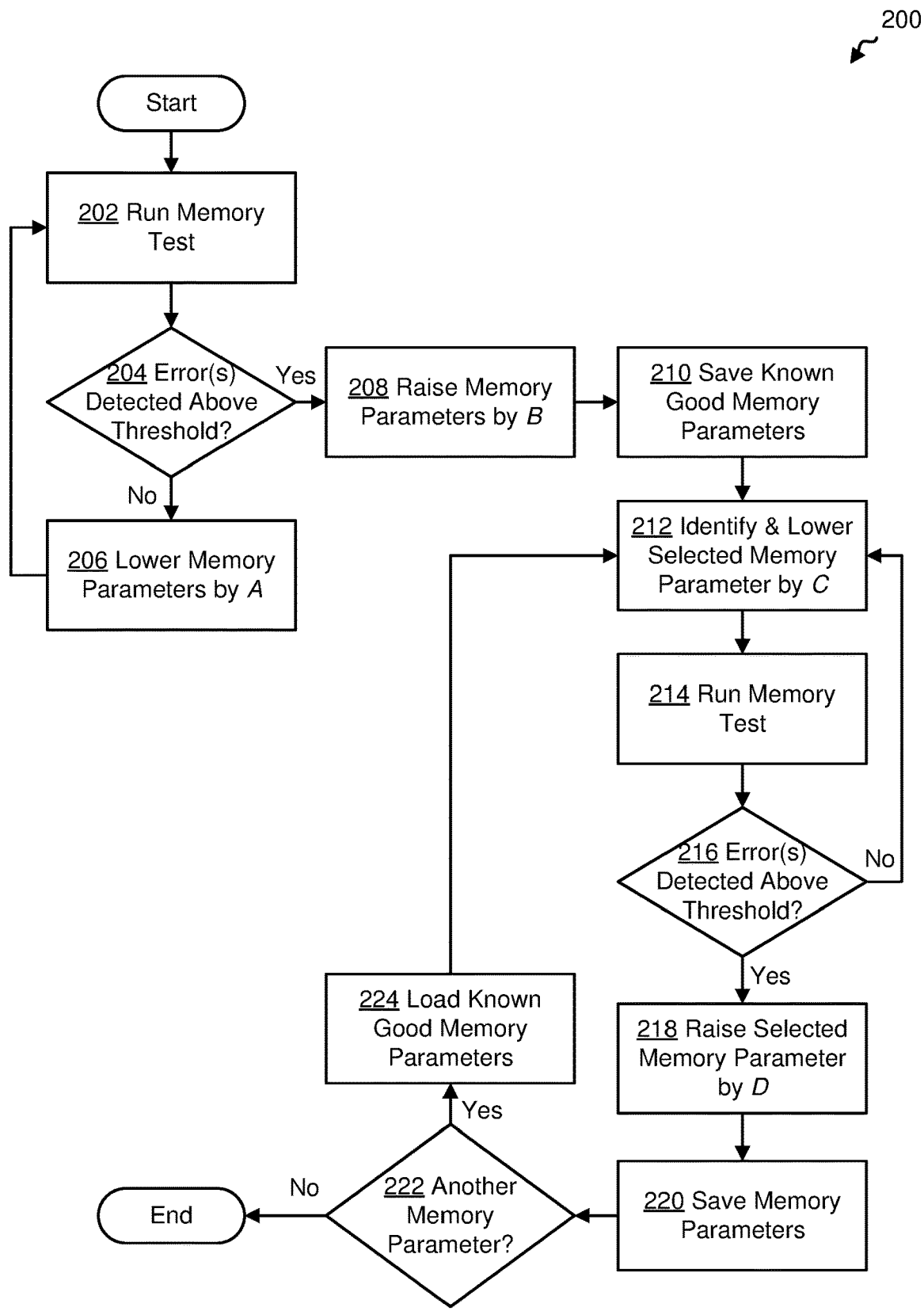
FIG. 2 depicts an example method for initial tuning of a memory system, in accordance with embodiments of the present disclosure.

Referring now to FIG. 2, depicted is an example method 200 for initial tuning of a memory system, in accordance with embodiments of the present disclosure. The following discussion will refer to method 200 being performed by a computer system, but method 200 can also be performed by a processor (including a flexible service processor), a memory controller, firmware or software running on a computer system, or other component(s) of a computer system. Method 200 can include more or less operations than those depicted. Method 200 can include operations in different orders than those depicted.

At 202, the computer system runs a memory test of a memory system, such as memory subsystem 120. This memory test can be a commercial "memtest" or any other test or collection of tests which can write various data or patterns of data to the memory system. This memory test can be run on the entire memory system or on a part of the memory system. Running the memory test on the entire memory system can take more time than running it on part of the memory system, but can provide more information than running it on a part of the memory system.

At 204, the computer system checks whether any errors were detected during the memory test. Such errors could be detected using error correcting codes (ECC). Various ECC schemes are known to one of skill in the art and can be used with varying levels of error detection and error correction. Embodiments using strong ECC schemes, such as ones using more parity bits, will result in more accurate determinations of whether errors have occurred and lead to improved accuracy of memory system tuning. In some embodiments, errors can also be detected using spare memory blocks or cells. In these embodiments, memory can be written to these spare memory blocks or cells and checked for errors upon reading these spare memory blocks or cells. In some embodiments, these spare memory blocks or cells can be selected intentionally by identifying memory blocks or cells which require the highest memory parameters in the memory system. For example, the computer system can detect which memory blocks or cells require the highest voltage to successfully operate, and use those memory blocks or cells as the spare memory blocks or cells for error detection. In some embodiments, a low level of errors may be tolerated before a determination is made that errors were detected and in other embodiments, a single error will trigger a determination that errors were detected. In some embodiments, there may be a threshold number, percentage, frequency, rate, or other amount of errors which dictates when a determination of errors were detected is made. In embodiments which allow for low levels of errors, lower memory parameters, such as voltage, access timings, and refresh timings may result from method 200, improving the efficiency and/or speed of the memory system at the cost of accuracy. In embodiments which do not tolerate any errors, method 200 will result in a more accurate memory system with higher memory parameters.

If at 204, the computer system did not determine that errors were detected (e.g. zero errors were detected or the level of errors detected was at or below a threshold amount of errors), method 200 proceeds to 206. At 206, the computer system lowers a set of memory parameters of the memory system by an amount A. The memory parameters lowered at 206 can include voltage, access timings, refresh timings, or other memory parameters. All such memory parameters may be lowered together, or a subset of the memory parameters may be lowered. Amount A can be a percentage or a fixed value. For example, at 206 the computer system may lower the voltage, access timings, and refresh timings of the memory system by 1% of their current values, where A is 1%. In some embodiments, amount A may refer to a collection of amounts where each amount corresponds to a particular memory parameter. For example, at 206 the computer system may lower the voltage of the memory system by 0.1 volts, the access timings of the memory system by 1 clock cycle, and refresh timings of the memory system by 1 clock cycle. In this example, amount A can correspond to [0.1,1,1] or any other representation of such information.

After completing operation 206, method 200 returns to operation 202 to run a memory test. By lowering memory parameters, looping back to operation 202, checking for a determination that errors were detected, and continuing to loop until such determination is made, method 200 continually lowers the memory parameters of the memory system to find a low point of acceptable memory parameters. Once a determination has been made at 204 that errors were detected, whether after the first or any subsequent memory test, method 200 proceeds to 208.

At 208, the computer system raises the memory parameters of the memory system by an amount B. The amount B should be greater than or equal to the amount A. By raising the memory parameters by at least the amount A, the memory parameters are raised back to a level before the memory system began to create errors (or errors in excess of an acceptable threshold). In some embodiments, amount B can be greater than amount A in order to provide a margin in order to prevent errors. Amount B can be similar to amount A in that it can correspond to voltage, access timings, refresh timings, or other memory parameters. Amount B can similarly be a percentage or a fixed value, and may be different for each memory parameter. For example, at 208 the computer system may raise the voltage, access timings, and refresh timings of the memory system by 3% of their current values, where B is 3%. In some embodiments, amount B may refer to a collection of amounts where each amount corresponds to a particular memory parameter. For example, at 208 the computer system may raise the voltage of the memory system by 0.3 volts, the access timings of the memory system by 3 clock cycles, and refresh timings of the memory system by 3 clock cycles. In this example, amount B can correspond to [0.3,3,3] or any other representation of such information. In some embodiments, method 200 may optionally include another memory test and check for determination of errors after operation 208 to ensure that the memory parameters were raised to a sufficient level to prevent errors, and may additionally optionally including looping from raising memory parameters, running memory tests, and checking for determination of errors until no errors (or an acceptable level of errors) are detected.

At 210, the computer system saves the memory parameters created at 208 by raising the memory parameters by B. These parameters can be referred to as "Known-Good" parameters to indicate they should not correspond to any errors (or to an acceptable level of errors) or can be referred to using any other designation for such parameters.

At 212, the computer system identifies a particular memory parameter and lowers its value by an amount C. The particular memory parameter can be any memory parameter chosen from the memory parameters lowered in 206 and raised in 208. For example, at 212, the computer system can lower the voltage parameter and lower it without lowering the other memory parameters. Amount C can be similar to amounts A and B including that it can be a percentage or a fixed value. Amount C can be equal to one or more of A and B (or one portion of A or B in embodiments where A and B are collections of amounts) or can be a different amount. In some embodiments, at 212 the computer system can identify a subset of the memory parameters lowered in 206 and raised in 208 instead of a single memory parameter.

At 214, the computer system runs a memory test, which can be the same or similar memory test as operation 202. At 216, the computer system checks whether any errors were detected during the memory test, which can occur in the same or a similar fashion as operation 204. If the computer system makes a determination that errors were not detected, method 200 returns to operation 212.

By looping back and again lowering a particular memory parameter, running a memory test at 214, and checking for a determination that errors were detected at 216 and continuing to loop until such determination is made, method 200 continually lowers the particular memory parameter of the memory system to find a low point of acceptable memory parameters with a focus on that particular memory parameter. As such, method 200 can determine whether a particular memory parameter can be lowered further alone (or as part of a subset of lowered memory parameters) compared to lowering all memory parameters. Once a determination has been made at 216 that errors were detected, method 200 proceeds to 218.

At 218, the computer system raises the particular memory parameter of the memory system by an amount D. The amount D should be greater than or equal to the amount C. By raising the particular memory parameter by at least the amount C, the particular memory parameter is raised back to a level before the memory system began to create errors (or errors in excess of an acceptable threshold). In some embodiments, amount D can be greater than amount C in order to provide a margin in order to prevent errors. Amount D can be similar to amount C including that it can be a percentage or a fixed value. Amount D can be equal to one or more of A and B or can be a different amount. In embodiments, where at 212 the computer system identified and selected a subset of the memory parameters lowered in 206 and raised in 208 instead of a single memory parameter, at 218, the same subset of memory parameters should be raised.

At 220, the computer system saves the memory parameters created at 218 by raising the particular memory parameter by D. These parameters can be referred to by the particular memory parameter adjusted, such as "Voltage Lowered" parameters or can be referred to using any other designation for such parameters.

At 222, the computer system checks whether there exists another memory parameter (or subset of memory parameters in embodiments using subsets) for which adjusted memory parameters using operations 212 through 220 have not been created. For example, if method 200 has been performed using voltage, access timings, and refresh timings, and operations 212 through 220 have been performed using voltage as the particular memory parameter and using access timings as the particular memory parameter, but not using refresh timings as the particular memory parameter, the computer system will determine at 222 another memory parameter exists (namely refresh timings).

If at 222 the computer system determines there exists another memory parameter from the set of memory parameters which has not been modified individually or as a subset of the set of memory parameters, method 200 proceeds to 224. At 224, the computer system loads the "Known-Good" parameters saved at 210. After 224, method 200 returns to 212 to identify and select another particular memory parameter (or subset of parameters). By loading these "Known-Good" parameters before returning to 212, method 200 can separate the results obtained for each particular memory parameter to continue separately evaluating each parameter.

When at 222, the computer system determines no additional memory parameters exist for which adjusted memory parameters using operations 212 through 220 have not been created, method 200 ends.

Method 200 can be performed when a computer system boots up or at any point in a computer system's start up process. Method 200 can also be started upon user command or user selection in response to a prompt. Method 200 can be performed every time a computer boots or less often, such as on a scheduled basis, whenever a system's settings or hardware have changed, or upon user command or response to prompt. Over time, as a memory system ages, its performance may worsen. Embodiments which perform method 200 more frequently can fine tune the memory system for its current functioning, at the cost of the time associated with performing method 200, whereas embodiments which perform method 200 on a scheduled basis or upon command/prompt may result in errors occurring between times when method 200 is performed.

Variations of method 200 can be envisioned by one skilled in the art in view of the above discussion. For example, discussed above were embodiments in which voltage, access timings, and refresh timings were lowered and raised together in operations 206 and 208, followed by individually raising and lowering voltage, access timings, and refresh timings separately. In some such embodiments, four sets of memory parameters will be created and may be labeled "Known-Good" parameters, "Voltage Lowered" parameters, "Access Timings Lowered" parameters, and "Refresh Timings Lowered" parameters. Additionally discussed were embodiments where subsets of parameters are lowered and raised in operations 212 through 220. In such embodiments, additional sets of memory parameters can be created and may be labeled "Voltage and Access Timings Lowered" parameters, "Voltage and Refresh Timings Lowered" parameters, and "Refresh Timings and Access Timings Lowered" parameters, in addition to or instead of the "Voltage Lowered" parameters, "Access Timings Lowered" parameters, and "Refresh Timings Lowered" parameters, resulting in seven sets of memory parameters in some cases. Embodiments may exist where only some of these parameter sets are created, or where additional parameter sets are created. In some embodiments, method 200 can end after operation 210 without individually tuning memory parameters in operations 212 through 220. In embodiments using more memory parameters, more than seven sets of memory parameters can be created. Additionally, in some embodiments, operation 224 can be skipped and individual memory parameters may be tuned in succession.

Figure 3:
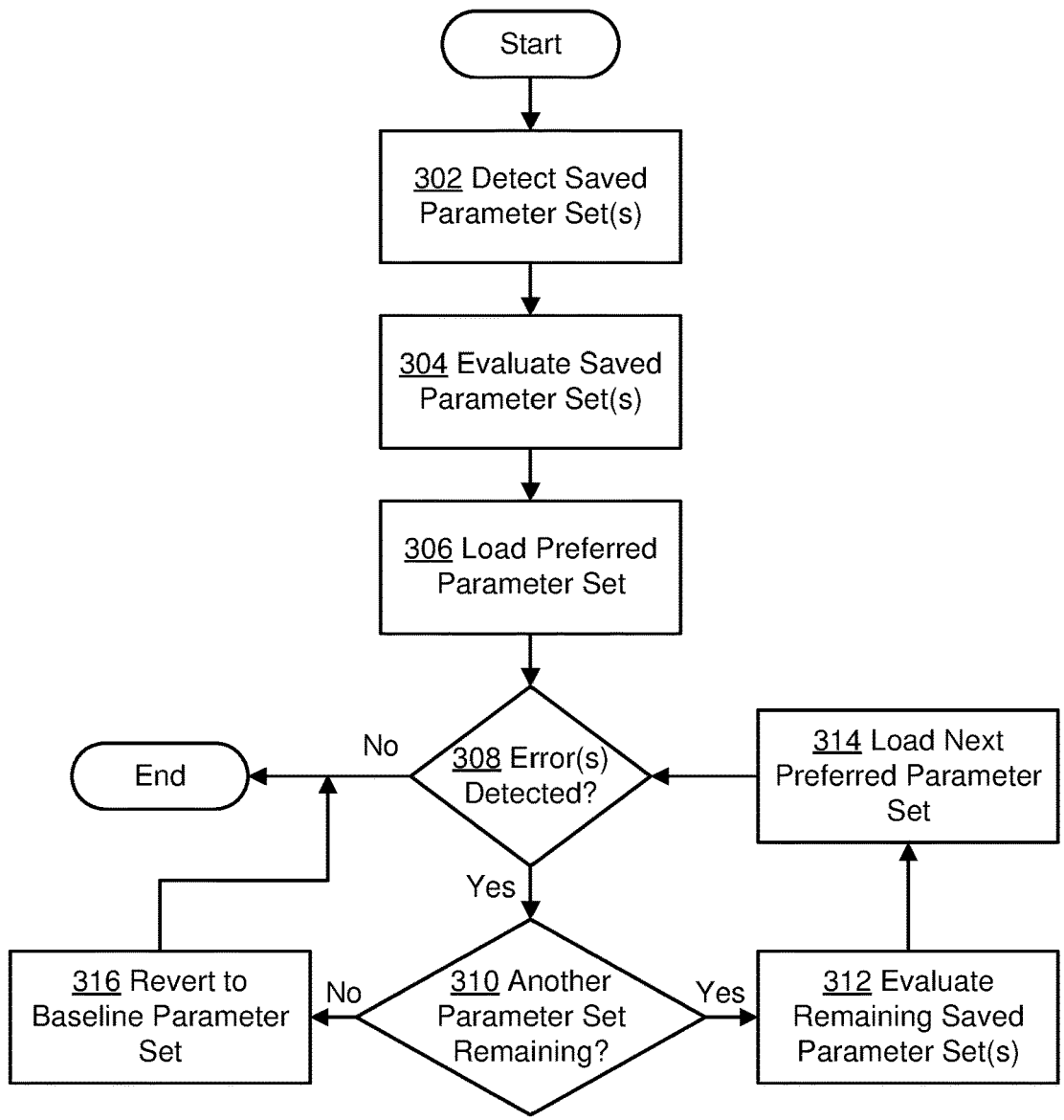
FIG. 3 depicts an example method for selecting and loading a set of memory parameters, in accordance with embodiments of the present disclosure.

Referring now to FIG. 3, depicted is an example method 300 for selecting and loading a set of memory parameters, in accordance with embodiments of the present disclosure. The following discussion will refer to method 300 being performed by a computer system, but method 300 can also be performed by a processor (including a flexible service processor), a memory controller, firmware or software running on a computer system, or other component(s) of a computer system. Method 300 can include more or less operations than those depicted. Method 300 can include operations in different orders than those depicted. Method 300 can commence upon completion of method 200, can be performed when a computer system boots up, at any point in a computer system's start up process, or upon user command or user selection in response to a prompt.

At 302, the computer system detects one or more saved memory parameter sets. These saved memory parameter sets can correspond to those created by method 200. In some embodiments, only the saved memory parameter sets from the most recent execution of method 200 can be detected, but in other embodiments, additional saved memory parameter sets may be detected.

At 304, the computer system evaluates the saved memory parameter sets. In embodiments where only one saved memory parameter set exists, operation 304 may be skipped. In embodiments where more than one saved memory parameter set exists, the computer system can compare the saved memory parameter sets. For example, a computer system may detect in operation 302 the four sets: "Known-Good" parameters, "Voltage Lowered" parameters, "Access Timings Lowered" parameters, and "Refresh Timings Lowered" parameters. In operation 304, the computer system can compare these saved memory parameter sets. This comparison can vary in embodiments.

In some embodiments, the comparison may result in the memory parameter set with the lowest overall memory parameters being the preferred memory parameter set. For example, if the "Voltage Lowered" parameters have a voltage value which is 3% lower than that present in the "Known-Good" parameters, the "Access Timings Lowered" parameters have access timings which are 1% lower than that present in the "Known-Good" parameters, and "Refresh Timings Lowered" parameters have refresh timings which are 5% lower than that present in the "Known-Good" parameters, the comparison can result in the "Refresh Timings Lowered" being the preferred memory parameter set. In some embodiments, the memory parameter sets can be ranked in order of preference. Continuing with the previous example, the "Voltage Lowered" parameters can be the second preferred memory parameter set, with the "Access Timings Lowered" parameters being the third preferred memory parameter set, and the "Known-Good" parameters being the fourth preferred memory parameter set.

In some embodiments, the comparison may result in a preferred memory parameter set based upon a preference for one particular memory parameter. For example, a computer system may have a rule which dictates that if the voltage parameter was able to be lowered past the "Known-Good" parameters, the "Voltage Lowered" parameters are the preferred memory parameter set regardless of the results of the other memory parameter sets. A series of rules can exist which dictates a hierarchy of memory parameters. For example, a computer system can place priority on voltage, then on access timings, with lowest priority to refresh timings.

More complicated rule or priority arrangements can be contemplated by those skilled in the art based upon this disclosure. For example, a computer system may place a priority on voltage, but only if it was lowered more than 5%, and if not, then another memory parameter may have priority. This disclosure is not to be limited to the specific examples presented herein.

At 306, the computer system loads the preferred memory parameter set determined during operation 304. At 308, the computer system checks for whether error(s) are detected. For example, a computer system may only accept parameters within a certain range. This may occur due to other components present in the system or another reason.

If the computer system does not detect an error at 308, method 300 ends. If the computer system does detect an error at 308, method 300 proceeds to operation 310. At 310, the computer system checks whether another memory parameter set remains which has not yet been loaded and resulted in an error. If another memory parameter set remains, method 300 proceeds to 312. At 312, the computer system can evaluate the remaining saved memory parameter sets in a fashion consistent with operation 304. If in operation 304 a ranked set of preferred memory parameter sets was created, operation 312 can be skipped. At 314, the computer system loads the next preferred memory parameter set and returns to operation 308 to check for error(s).

If at 310, the computer system does not detect any remaining memory parameter sets, method 300 proceeds to operation 316. At 316, the computer system reverts to the baseline memory parameter set which the memory manufacturer supplied the memory at. By allowing reversion to baseline parameters, method 300 ensures that the computer system can function even if all saved memory parameter sets resulted in errors. After operation 316, method 300 ends.

Figure 4:
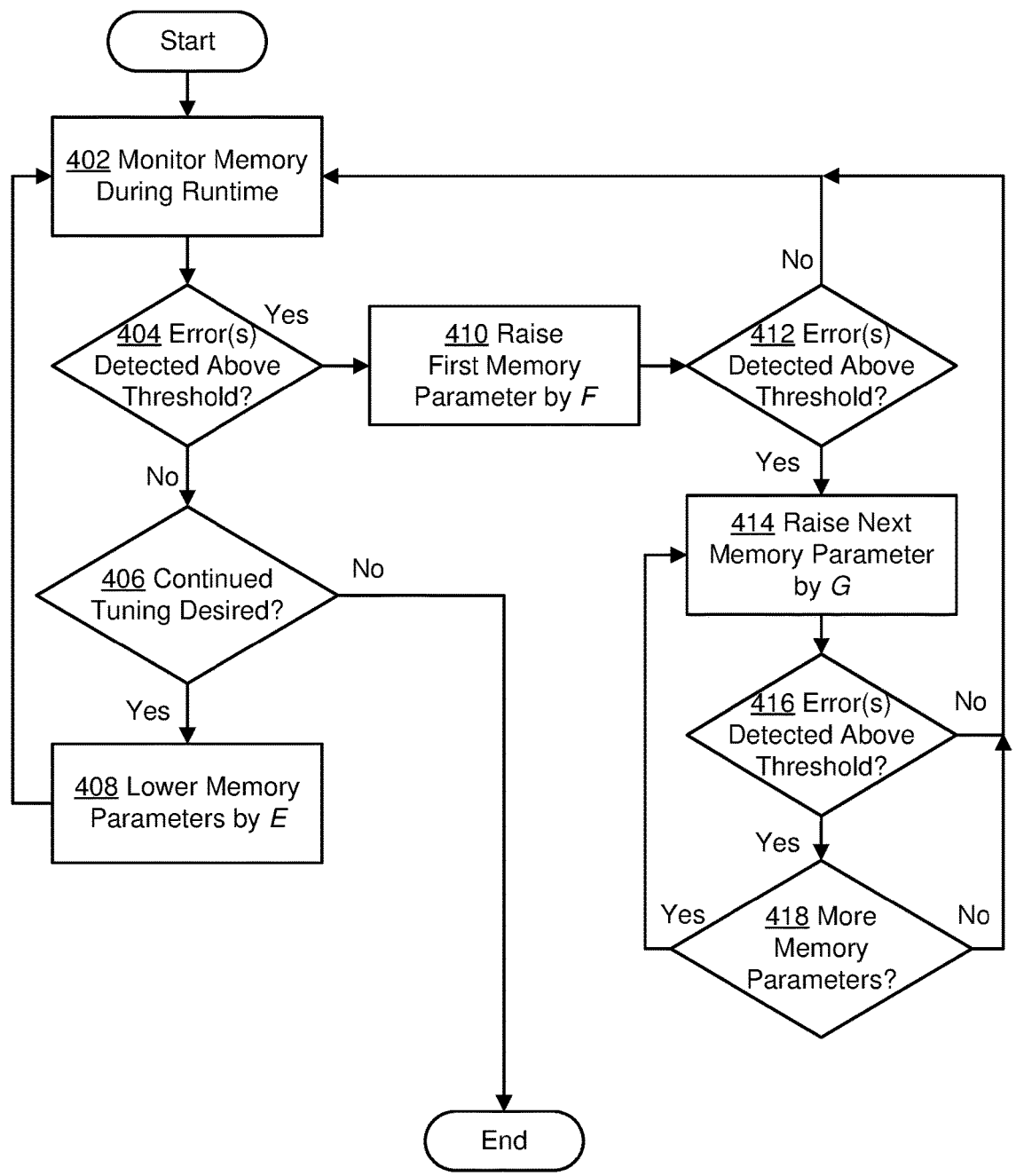
FIG. 4 depicts an example method for monitoring and tuning a memory system during runtime, in accordance with embodiments of the present disclosure.

Referring now to FIG. 4, depicted is an example method 400 for monitoring and tuning a memory system during runtime, in accordance with embodiments of the present disclosure. The following discussion will refer to method 400 being performed by a computer system, but method 400 can also be performed by a processor (including a flexible service processor), a memory controller, firmware or software running on a computer system, or other component(s) of a computer system. Method 400 can include more or less operations than those depicted. Method 400 can include operations in different orders than those depicted.

At 402, a computer system monitors the memory system during runtime. Monitoring of the memory system during runtime can also refer to during real time, while the memory system is online, or any similar designation that the memory system is operating. This monitoring can include checking for errors in the memory system or error alerts. At 404, the computer system determines whether error(s) are detected. Operation 404 can proceed similarly or identically to operation 204 of method 200.

If at 404, no errors are detected, method 400 proceeds to operation 406. At 406, the computer system determines if continued tuning of the memory system is desired. As will be discussed in more detail below, continued memory tuning will entail lowering memory parameters until errors are detected and raising memory parameters until errors are no longer detected. A computer system can monitor this process and determine that the same or similar memory parameters result in no errors, but that further attempts to lower parameters are unsuccessful and result in errors. In such case, the computer system can determine that further tuning of the memory system is not desired. In order to assist in such determinations, a computer system can, in some embodiments, keep a log of error-free memory parameter sets and/or a log of memory parameter sets which resulted in errors, or any other such tracking system. A computer system may also determine that further tuning of the memory system is not desired in order to save the resources involved in performing method 400. If the computer system does determine that further tuning of the memory system is not desired, method 400 ends.

If at 406, the computer system determines that further tuning of the memory system is desired, method 400 proceeds to operation 408. At 408, the computer system lowers memory parameters by amount E. Operation 408 can proceed in a similar or identical fashion to operation 206 of method 200. Amount E can be the same as amount A of operation 206 of method 200 or can be any other amount. After operation 408, method 400 returns to operation 402 to continue monitoring the memory system. By lowering memory parameters, looping back to operation 402, checking for a determination that errors were detected, and continuing to loop until such determination is made (or it is determined continued tuning is not desired), method 400 continually lowers the memory parameters of the memory system to find a low point of acceptable memory parameters. Once a determination has been made at 404 that errors were detected, method 400 proceeds to 410.

At 410, the computer system raises a first memory parameter of the memory parameters lowered in 408 by an amount F. In some embodiments, the amount F can be greater than or equal to the amount E. By raising the first memory parameter by at least the amount F, the first memory parameter is raised back to a level before the memory system began to create errors (or errors in excess of an acceptable threshold). In some embodiments, amount F can be greater than amount E in order to provide a margin in order to prevent errors. In some embodiments, the amount F can be less than the amount E in an effort to keep the memory parameter as low as possible. In such embodiments, additional looping of checking for errors and raising of the first memory parameter again when errors remain could be used. Amount F can be similar to amounts A-E in that it can correspond to voltage, access timings, refresh timings, or other memory parameters, and can similarly be a percentage or a fixed value. For example, at 410 the computer system may raise the voltage of the memory system by 3% of its current value, where F is 3%. In some embodiments, instead of raising a first memory parameter by an amount F, the computer system can raise a subset of the memory parameters or raise all memory parameters at once. Embodiments raising multiple parameters will return the system to error-free operation quicker, but may unnecessarily raise one or more memory parameters.

At 412, the computer system determines whether error(s) are detected. Operation 412 can proceed similarly or identically to operation 404 or operation 204 of method 200. If at 412, no errors are detected, then the raising of the first memory parameter at 410 fixed the cause of the errors and further raising of other memory parameters may be unnecessary. As such, method 400 proceeds back to operation 402 to continue monitoring the memory system. If error(s) were detected at 412, method 400 proceeds to operation 414.

At 414, the computer system raises a next memory parameter of the memory parameters lowered in 408 by an amount G. Operation 414 can proceed in the same or similar fashion as operation 410, but raising a different memory parameter (or in embodiments using subsets of memory parameters, a different subset). Amount G can be similar to amounts A-F in that it can correspond to voltage, access timings, refresh timings, or other memory parameters, and can similarly be a percentage or a fixed value. For example, at 414 the computer system may raise the refresh timings of the memory system by 2% of its current value, where G is 2%.

At 416, the computer system determines whether error(s) are detected. Operation 416 can proceed similarly or identically to operation 404, 412, or operation 204 of method 200. If at 416, no errors are detected, then the raising of the second memory parameter at 414 fixed the cause of the errors and further raising of other memory parameters may be unnecessary. As such, method 400 proceeds back to operation 402 to continue monitoring the memory system. If error(s) were detected at 416, method 400 proceeds to operation 418.

At 418, the computer system checks whether more memory parameters remain of the memory parameters lowered in 408 which have not been raised in operations 410 or 414. If one or more additional memory parameters remain, method 400 returns to operation 414 to raise another memory parameter. The amount G for the next memory parameter may be the same as for the previous memory parameter or can be a different value. If at 418, no additional memory parameters remain, method 400 returns to operation 402 to continue monitoring the memory system. In some embodiments, if at 418, there are no additional memory parameters which have not been raised, but there were still errors detected at 416, method 400 could return instead to operation 410 to continue raising one or more memory parameters until no errors are detected.

Method 400 can continue to loop between lowering memory parameters until errors occur and raising one or more memory parameters until errors cease, until the computer system is no longer active or until the computer system determines at 406 that continued tuning is not desired.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for dynamic memory tuning, the method comprising:
   identifyinq, by a computer, memory cells which require multiple different levels of a memory parameter;
   monitoring, by the computer, a memory system during operation, using spare memory cells selected by identifying memory cells which require a highest level of the multiple different levels of the memory parameter to operate;
   detecting, by the computer, a first number of errors in the memory system;
   determining, by the computer, that the first number of errors is below an error level threshold;
   lowering, by the computer, a first group of one or more memory parameters of the memory system by a first amount;
   detecting, by the computer and after the lowering of one or more memory parameters by the first amount, a second number of errors in the memory system;
   determining, by the computer, that the second number of errors is above the error level threshold; and
   raising, by the computer, a second group of one or more memory parameters of the memory system by a second amount.

2. The method of claim 1, further comprising:
   running, by the computer, a memory test upon boot;
   identifying, by the computer, one or more memory parameter sets;
   evaluating, by the computer, the one or more memory parameter sets; and
   loading, by the computer, a preferred memory parameter set.

3. The method of claim 2, wherein the evaluating the one or more memory parameter sets further comprises:
   comparing, by the computer, parameter values among the one or more memory parameter sets;
   identifying, by the computer, a memory parameter set with lowest memory parameters by determining a memory parameter set with the lowest parameters is the memory parameter set with a memory parameter relatively lower than a lowest memory parameter in at least one other memory parameter set; and
   selecting, by the computer, the memory parameter set with the lowest memory parameters as the preferred memory parameter set.

4. The method of claim 2, wherein the evaluating the one or more memory parameter sets further comprises:
   comparing, by the computer, parameter values among the one or more memory parameter sets;
   identifying, by the computer, a particular memory parameter; and
   selecting, by the computer, the memory parameter set which has the particular memory parameter at a lowest value as the preferred memory parameter set.

5. The method of claim 2, further comprising:
   detecting, by the computer, an error upon loading the preferred memory parameter set; and
   reverting, by the computer, in response to detecting an error upon loading the preferred memory parameter set, to a baseline memory parameter set.

6. The method of claim 2, wherein the identifying one or more memory parameter sets further comprises:
   detecting, by the computer, a third number of errors in the memory system;
   determining, by the computer, that the third number of errors is below the error level threshold;
   lowering, by the computer, a third group of one or more memory parameters of the memory system by a third amount;
   detecting, by the computer and after the lowering of the third group of one or more memory parameters by the third amount, a fourth number of errors in the memory system;
   determining, by the computer, that the fourth number of errors is above the error level threshold;
   raising, by the computer, the third group of one or more memory parameters of the memory system by a fourth amount; and
   saving, by the computer, values of the one or memory parameters as a first memory parameter set.

7. The method of claim 6, further comprising:
   identifying, by the computer, a selected memory parameter of the third group of one or more memory parameters;
   lowering, by the computer, the selected memory parameter by a fifth amount, wherein the fifth amount is a different amount than the first amount and third amount;
   running, by the computer, the memory test;
   detecting, by the computer and after the lowering of the selected memory parameter by the fifth amount, a fifth number of errors in the memory system;
   determining, by the computer, that the fifth number of errors is above the error level threshold;
   raising, by the computer, the selected memory parameter by a sixth amount; and
   saving, by the computer, values of the one or memory parameters as a second memory parameter set.

8. The method of claim 1, wherein the computer uses spare memory blocks containing the spare memory cells to detect the first number of errors and second number of errors.

9. The method of claim 1, wherein the computer uses error correcting codes (ECC) to detect the first number of errors and second number of errors.

10. The method of claim 1, wherein the second amount is greater than or equal to the first amount.

11. The method of claim 1, wherein the memory parameters of the memory system are one or more of: voltage, refresh timings, and access timings.

12. The method of claim 1, further comprising:
    creating, by the computer, a log of detected numbers of errors in the memory system corresponding to values of the first group of one or more memory parameters.

13. A system for dynamic memory tuning, the system comprising:
    one or more processors; and
    a memory communicatively coupled to the one or more processors,
    wherein the memory comprises instructions which, when executed by the one or more processors, cause the one or more processors to perform a method comprising the steps of:
    identifying, by a computer, memory cells which require multiple different levels of a memory parameter;
    monitoring, by the computer, a memory system during operation, using spare memory cells selected by identifying memory cells which require a highest level of the multiple different levels of the memory parameter to operate;
    detecting, by the computer, a first number of errors in the memory system;

determining, by the computer, that the first number of errors is below an error level threshold;

lowering, by the computer, a first group of one or more memory parameters of the memory system by a first amount;

detecting, by the computer and after the lowering of one or more memory parameters by the first amount, a second number of errors in the memory system;

determining, by the computer, that the second number of errors is above the error level threshold; and raising, by the computer, a second group of one or more memory parameters of the memory system by a second amount.

14. The system of claim 13, further comprising:

running, by the computer, a memory test upon boot;

identifying, by the computer, one or more memory parameter sets;

evaluating, by the computer, the one or more memory parameter sets; and loading, by the computer, a preferred memory parameter set.

15. The system of claim 14, wherein the evaluating the one or more memory parameter sets further comprises:

comparing, by the computer, the one or more memory parameter sets;

identifying, by the computer, a memory parameter set with lowest memory parameters by determining a memory parameter set with the lowest parameters is the memory parameter set with a memory parameter relatively lower than a lowest memory parameter in at least one other memory parameter set; and selecting, by the computer, the memory parameter set with the lowest memory parameters as the preferred memory parameter set.

16. The system of claim 14, wherein the evaluating the one or more memory parameter sets further comprises:

comparing, by the computer, the one or more memory parameter sets;

identifying, by the computer, a particular memory parameter; and selecting, by the computer, the memory parameter set which has the particular memory parameter at a lowest value as the preferred memory parameter set.

17. A computer program product for dynamic memory tuning, the computer program product comprising a computer readable storage medium having program instructions embodied therewith, wherein the computer readable storage medium is not a transitory signal per se, the program instructions executable by a computer to perform a method comprising the steps of:

identifying, by a computer, memory cells which require multiple different levels of a memory parameter;

monitoring, by the computer, a memory system during operation, using spare memory cells selected by identifying memory cells which require a highest level of the multiple different levels of the memory parameter to operate;

detecting, by the computer, a first number of errors in the memory system;

determining, by the computer, that the first number of errors is below an error level threshold;

lowering, by the computer, a first group of one or more memory parameters of the memory system by a first amount;

detecting, by the computer and after the lowering of one or more memory parameters by the first amount, a second number of errors in the memory system;

determining, by the computer, that the second number of errors is above the error level threshold; and raising, by the computer, a second group of one or more memory parameters of the memory system by a second amount.

18. The computer program product of claim 17, further comprising:

running, by the computer, a memory test upon boot;

identifying, by the computer, one or more memory parameter sets;

evaluating, by the computer, the one or more memory parameter sets; and loading, by the computer, a preferred memory parameter set.

19. The computer program product of claim 18, wherein the evaluating the one or more memory parameter sets further comprises:

comparing, by the computer, the one or more memory parameter sets;

identifying, by the computer, a memory parameter set with lowest memory parameters by determining a memory parameter set with the lowest parameters is the memory parameter set with a memory parameter relatively lower than a lowest memory parameter in at least one other memory parameter set; and selecting, by the computer, the memory parameter set with the lowest memory parameters as the preferred memory parameter set.

20. The computer program product of claim 18, wherein the evaluating the one or more memory parameter sets further comprises:

comparing, by the computer, the one or more memory parameter sets;

identifying, by the computer, a particular memory parameter; and selecting, by the computer, the memory parameter set which has the particular memory parameter at a lowest value as the preferred memory parameter set.

* * * * *